US 6,624,035 B1

(12) United States Patent
Luning et al.

(10) Patent No.: US 6,624,035 B1
(45) Date of Patent: *Sep. 23, 2003

(54) METHOD OF FORMING A HARD MASK FOR HALO IMPLANTS

(75) Inventors: Scott D. Luning, Austin, TX (US); David Donggang Wu, Austin, TX (US); Massud Aminpur, Dresden (DE)

(73) Assignee: Advanced Micro Devices, Inc., Austin, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/523,631

(22) Filed: Mar. 13, 2000

(51) Int. Cl.$^7$ ............................................. H01L 21/336
(52) U.S. Cl. ...................... 438/302; 438/289; 438/525
(58) Field of Search .................. 438/302, 510, 438/514, 518, 519, 525, 526, 527, 301, 289, 305, 306, 290, 291; 257/402, 403, 404, 335

(56) References Cited

U.S. PATENT DOCUMENTS

| | | | | |
|---|---|---|---|---|
| 5,166,087 A | * | 11/1992 | Kakimoto et al. ............ 438/302 |
| 5,518,941 A | * | 5/1996 | Lin et al. ....................... 438/291 |
| 5,534,449 A | * | 7/1996 | Dennison et al. ............ 438/231 |
| 5,741,736 A | * | 4/1998 | Orlowski et al. ............. 438/286 |
| 5,834,355 A | * | 11/1998 | Doyle ........................... 438/305 |
| 5,976,937 A | * | 11/1999 | Rodder et al. ................ 438/209 |
| 6,017,798 A | * | 1/2000 | Ilderem et al. ............... 438/286 |
| 6,087,227 A | * | 7/2000 | Hsu ............................... 438/275 |
| 6,156,593 A | * | 12/2000 | Peng et al. .................... 438/200 |
| 6,194,278 B1 | * | 2/2001 | Rengarajan ................... 438/302 |
| 6,238,967 B1 | * | 5/2001 | Shiho et al. ................... 438/243 |
| 6,300,205 B1 | * | 10/2001 | Fulford et al. ................ 438/303 |
| 6,362,054 B1 | * | 3/2002 | Choi et al. .................... 438/266 |
| 2001/0046745 A1 | * | 11/2001 | Divakaruni et al. ......... 438/306 |
| 2002/0055212 A1 | * | 5/2002 | Choi et al. .................... 438/197 |

* cited by examiner

Primary Examiner—Eddie Lee
Assistant Examiner—José R. Díaz
(74) Attorney, Agent, or Firm—Williams, Morgan & Amerson, P.C.

(57) ABSTRACT

The present invention is directed to a method of forming halo implants in a semiconductor device. In one illustrative embodiment, the method comprises forming a gate electrode above a surface of a semiconducting substrate, and forming a hard mask layer above the gate electrode and the substrate. The method further comprises patterning the hard mask layer to define an opening in the hard mask layer, and performing an angled implantation process through the opening in the hard mask to introduce dopant atoms into the substrate under at least a portion of the gate electrode.

27 Claims, 2 Drawing Sheets

METHOD OF FORMING A HARD MASK FOR HALO IMPLANTS

BACKGROUND OF THE INVENTION

1. Field of the Invention

The present invention is generally directed to the field of semiconductor processing, and, more particularly, to a method of forming halo implants in semiconductor devices.

2. Description of the Related Art

There is a constant drive within the semiconductor industry to increase overall performance and operating speed of integrated circuit devices, e.g., microprocessors, memory devices, and the like. This drive is fueled by consumer demands for computers and electronic devices that operate at increasingly greater speeds. This demand for increased speed has resulted in a continual reduction in the size of semiconductor devices, e.g., transistors. That is, many components of a typical field effect transistor (FET), e.g., channel length, junction depths, gate dielectric thickness, and the like, are reduced. For example, all other things being equal, the smaller the channel length of the transistor, the faster the transistor will operate. Thus, there is a constant drive to reduce the size, or scale, of the components of a typical transistor to increase device performance and the overall speed of the transistor, as well as integrated circuit devices incorporating such transistors.

Moreover, there is a constant drive to increase the density of modem integrated circuit devices, ie., to put more and more semiconductor devices, e.g., transistors, closer and closer together on a single chip. Increasing the density of integrated circuit devices makes more efficient use of the substrate plot space, and may assist in increasing the overall yield from semiconductor manufacturing operations.

One problem encountered in efforts to increase the density of modem integrated circuit devices arises from limitations of the processes used to form halo implants in semiconductor devices. By way of background, halo implants are typically formed by implanting dopant atoms at an angle with respect to the surface of the substrate so as to result in a doped region that extends slightly under the gate stack of a typical field effect transistor. The dopant atoms used to form the halo implants will typically be comprised of the same type of dopant (N-type or P-type) as used to dope the underlying substrate. For example, in the case of forming NMOS devices, the halo implant will be comprised of a P-type dopant, e.g., boron. The purpose of the halo implant is to reduce the so-called short channel effects that are a result of device sizes being continually reduced. In particular, the halo implants are made in an effort to control or reduce the variations in the threshold voltage of an integrated circuit device due to variations in the channel length of the device. Despite a great effort, variations in the channel length of semiconductor devices are not uncommon. These variations occur due to a variety of reasons, e.g., manufacturing tolerances, implant variations, photolithography variations, etching variations, etc.

Many modern integrated circuit devices are comprised of both NMOS-type devices and PMOS-type devices, or a combination of both, e.g., CMOS technology. During the formation of these various halo implants, one of the types of devices, e.g., PMOS devices, must be covered or masked with a layer of material, such as photoresist, such that the dopant atoms are implanted only into the appropriate devices, i.e., the layer of photoresist keeps the dopant atoms from being implanted into unwanted areas. However, since the halo implants are typically performed at an angle, e.g., 45 degrees, the height of the layer of photoresist limits how close the devices of different construction, e.g, NMOS and PMOS devices, may be placed together. This, in turn, causes an undesirable consumption of plot space on an integrated circuit device.

Moreover, the height of the photoresist mask cannot be readily reduced as existing photolithography equipment has a minimum formed thickness requirement of approximately 5000 Å. Of course, it is anticipated that efforts are being made, or will be made, to reduce the minimum thickness to which layers of photoresist may be formed. However, what is desired is a method of forming halo implants in which a masking layer is made to a minimum height requirement that is sufficient to perform the masking function, thereby allowing devices to be spaced more closely together on an integrated circuit device. This, in turn, will increase density and product yields in semiconductor device manufacturing.

The present invention is directed to a method that solves or at least reduces some or all of the aforementioned problems.

SUMMARY OF THE INVENTION

The present invention is directed to a method of forming halo implants in a semiconductor device. In one illustrative embodiment, the method comprises forming a gate electrode above a surface of a semiconducting substrate, and forming a hard mask layer above the gate electrode and the substrate. The method further comprises patterning the hard mask layer to define an opening in the hard mask layer, and performing an angled implantation process through the opening in the hard mask to introduce dopant atoms into the substrate under at least a portion of the gate electrode.

BRIEF DESCRIPTION OF THE DRAWINGS

The invention may be understood by reference to the following description taken in conjunction with the accompanying drawings, in which like reference numerals identify like elements, and in which.

Figure 1:
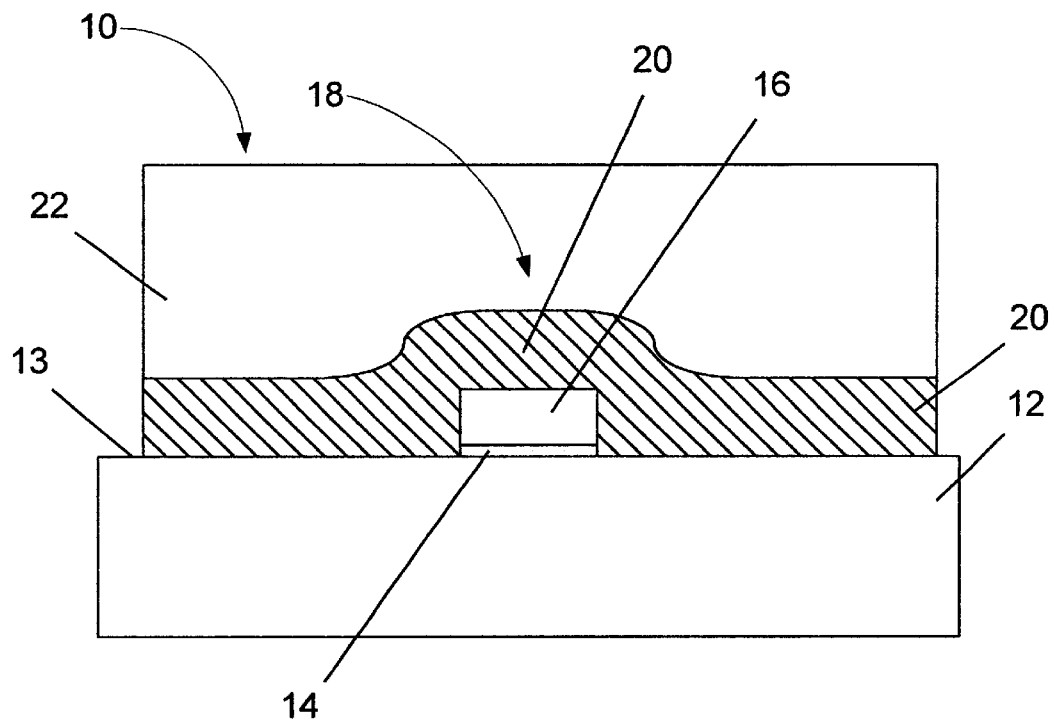
FIG. 1 is a cross-sectional view of an illustrative, partially-formed semiconductor device with a layer of photoresist formed thereabove.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to FIGS. 1–4. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features depicted in the drawings may be exaggerated or reduced as compared to the size of those feature sizes on fabricated devices. Nevertheless, the attached drawings are included to describe and explain illustrative examples of the present invention.

In general, the present invention is directed to a method of forming halo implants in semiconductor devices. As will be readily apparent to those skilled in the art upon a complete reading of the present application, the present method is applicable to a variety of technologies, e.g., NMOS, PMOS, CMOS, etc., and is readily applicable to a variety of devices, including, but not limited to, logic devices, memory devices, etc.

A partially-formed semiconductor device 10 is depicted in FIG. 1. The device 10 is comprised of a gate dielectric 14 formed above a surface 13 of a semiconducting substrate 12, and a gate electrode 16 formed above the gate dielectric 14. Taken collectively, the gate electrode 16 and the gate dielectric 14 may be considered a gate stack 18.

The particular materials of construction as well as the techniques for forming the gate dielectric 14 and gate electrode 16 may be varied as a matter of design choice. For example, the semiconducting substrate 12 may be comprised of a variety of materials, such as a silicon with a layer of epitaxial silicon (not shown) formed thereabove, e.g., a P-type layer of epitaxial silicon formed over a P-doped bulk silicon substrate.

The materials comprising the gate dielectric layer 14 and the gate electrode layer 16 may be varied as a matter of design choice. For example, the gate dielectric layer 14 may be comprised of silicon dioxide or a nitrogen bearing oxide, and the gate electrode layer 16 may be comprised of polycrystalline silicon (polysilicon). Dopant atoms may also be added to the gate electrode by, for example, an ion implantation process, to reduce the sheet resistance of the gate electrode. Moreover, these layers may be formed by a variety of known techniques for forming such layers, such as thermal growth, chemical vapor deposition "CVD"), physical vapor deposition "PVD"), plasma enhanced chemical vapor deposition "PECVD"), sputtering, etc. Thus, the particular materials of construction as well as the manner of making the gate dielectric layer 14 and the gate electrode layer 16 should not be considered a limitation of the present invention unless specifically recited in the appended claims. In one illustrative embodiment, the gate dielectric layer 14 is comprised of a thermally grown layer of silicon dioxide having a thickness ranging from approximately 15–30 Å, and the gate electrode layer 16 is comprised of approximately 1000–2000 Å of polysilicon that is formed by a deposition process.

Thereafter, as shown in FIG. 1, a hard mask layer 20 may be formed above the gate electrode 16 and the substrate 12. The hard mask layer 20 may be comprised of a variety of materials sufficient to prevent the dopant atoms implanted during the halo implant process from penetrating into the substrate 12. For example, the hard mask layer 20 may be comprised of a nitride, e.g., silicon nitride, or any oxynitride, e.g., silicon oxynitride. In one illustrative embodiment, the hard mask layer 20 may be made of any material that can perform its blocking function and be selectively etched with respect to other oxides that may be present on the integrated circuit devices, e.g., field oxides comprised of, for example, silicon dioxide.

The thickness of the hard mask layer 20 may be varied as a matter of design choice. In general, the hard mask layer 20 may be made to a minimum thickness sufficient to serve its function of blocking the dopant atoms during the halo implantation process. Of course, the hard mask layer 20 may be made thicker than that if desired due to manufacturing problems or any other process considerations. Due to the fact that the hard mask layer 20 will be made of a material that is more dense than that of a layer of photoresist, the hard mask layer 20 may be made thinner than a layer of photoresist, yet still serve its blocking function. For example, the hard mask layer 20 may be made to a thickness ranging from approximately 1500–4000 Å. The masking layer 20 may be formed by any of a variety of techniques known for forming such layers, e.g., CVD, PVD, PECVD, sputtering, etc. In one illustrative embodiment, the hard mask layer 20 is comprised of a layer of silicon nitride having a thickness of approximately 3000 Å that is formed by a CVD process.

Thereafter, as shown in FIG. 1, a layer of photoresist 22 is formed above the hard mask layer 20. The layer of photoresist 22 may be formed using traditional photolithography equipment and standard techniques. The thickness of the layer of photoresist 22 may be varied as a matter of design choice. In one illustrative embodiment, the layer of photoresist 22 may be formed so as to have a thickness of approximately 5000 Å, and it may be formed by a spin-coating process.

Figure 2:
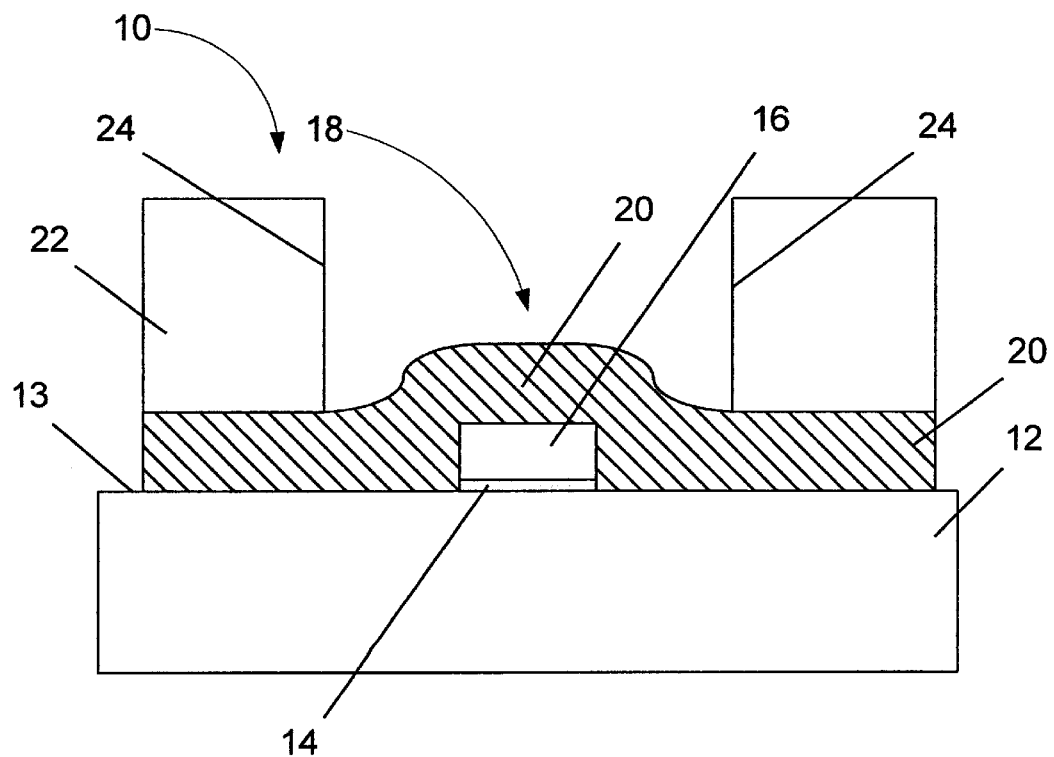
FIG. 2 is a cross-sectional view of the device shown in FIG. 1 after an opening has been formed in the layer of photoresist.
Figure 3:
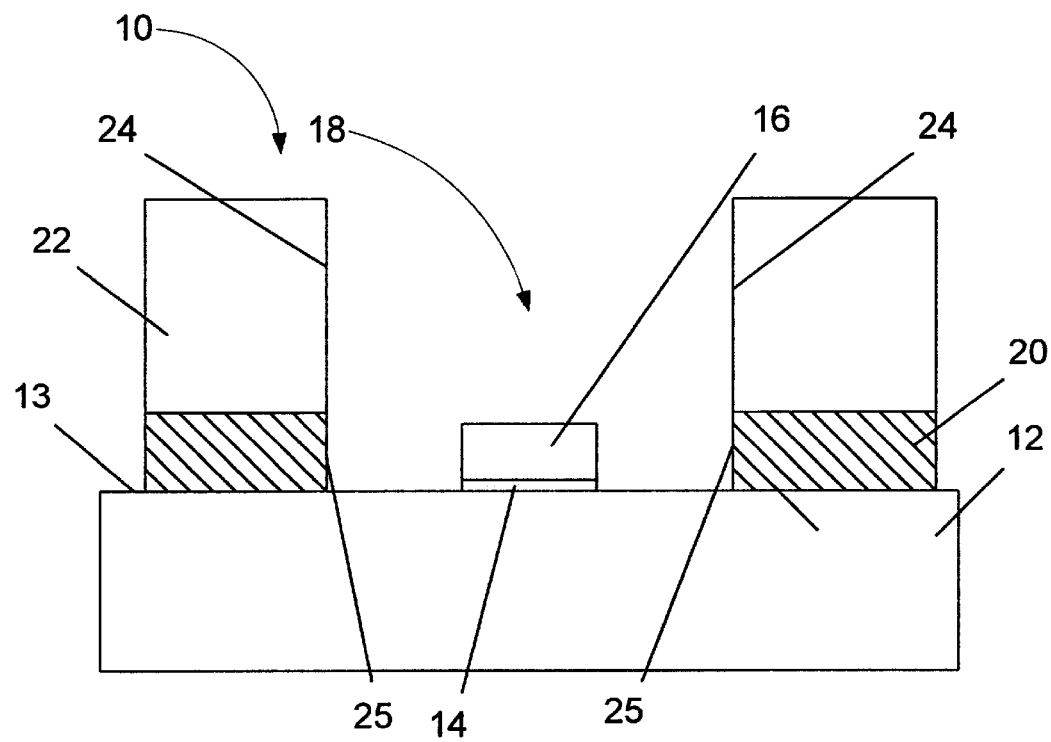
FIG. 3 is a cross-sectional view of the device shown in FIG. 2 after an etching operation has been performed to remove a portion of a hard mask layer.

Next, as shown in FIG. 2, the layer of photoresist 22 is patterned to define an opening 24. This patterning operation may be performed by traditional photolithography techniques, e.g., the layer of photoresist 22 may be selectively exposed to a light source and portions may be subsequently removed. Thereafter, as shown in FIG. 3, the portion of the hard mask layer 20 lying within the opening 24 in the layer of photoresist 22 is removed by performing one or more etching processes to define an opening 25 in the hard mask layer 20. In one illustrative embodiment, an isotropic plasma etching process is performed to define the opening 25 in the hard mask layer 20. Note that, during the process, the portions of the substrate 12 lying between the gate stack 18 and the opening 25 in the hard mask layer 20 may be exposed. Of course, although not depicted in the drawings, the layer of material used to form the gate dielectric 14, e.g., the gate oxide layer, may still be present above the surface 13 of the substrate 12 in this area. In fact, the hard mask layer 20 may be initially formed above such a layer if desired.

Figure 4:
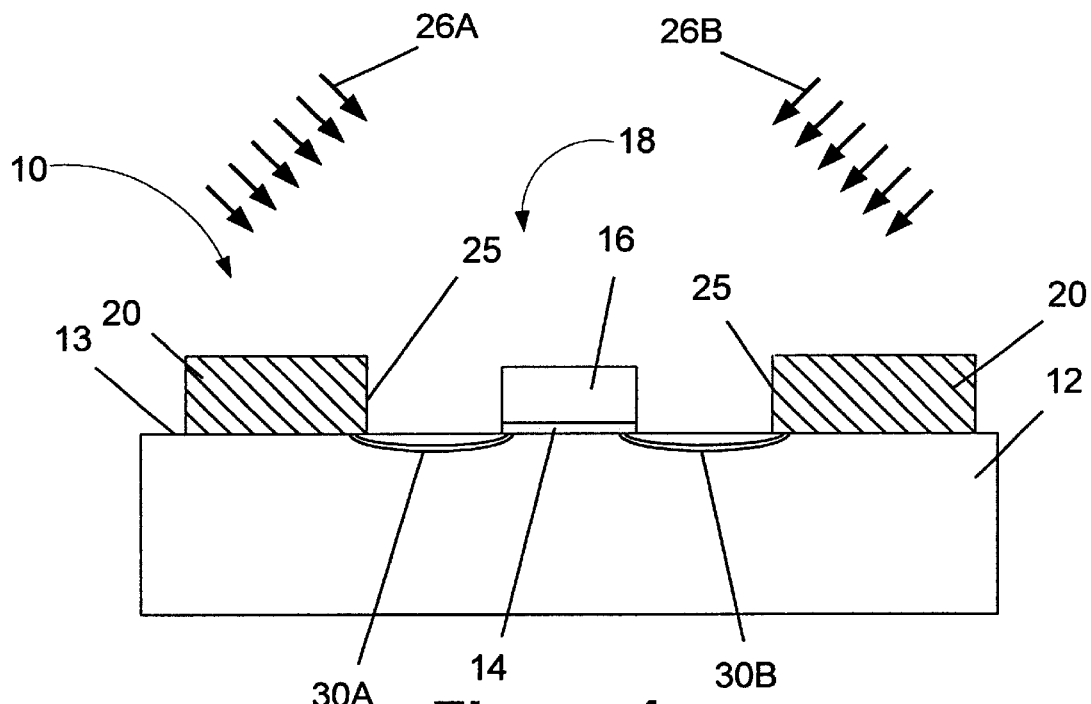
FIG. 4 is a cross-sectional view of the device shown in FIG. 3 after the photoresist has been removed and the angled halo implant process is performed.

Thereafter, as shown in FIG. 4, the patterned layer of photoresist 22 is removed using traditional processing techniques, leaving the patterned hard mask layer 20 formed above the substrate 12. Thereafter, as indicated by arrows 26A and 26B, halo implantation processes are performed to form the halo implant 30A and 30B (schematically indicated in FIG. 4), at least a portion of which extends under a portion of the gate electrode 16.

The halo implants 30A, 30B may be formed using a variety of process techniques and, thus, the particular technique employed to form the halo implants should not be considered a limitation of the present invention unless specifically set forth in the appended claims. For example, the semiconducting substrate 12 may be tilted downward in an ion implantation tool (not shown) at the appropriate angle, and the dopant atoms may be introduced by injecting the ions in a vertically downward direction. Alternatively, the semiconducting substrate 12 may be positioned in horizontal position in the implantation tool, and the dopant atoms could be directed downward toward the substrate at the appropriate angle, as indicated in FIG. 4. Of course, there may be other techniques used to introduce the dopant atoms into the substrate at an angle so as to implant some of the desired dopant atoms, e.g., halo implant 30A, 30B, under a portion of the gate stack 18.

Additionally the concentration of dopant atoms, as well as the energy level of the halo implant process, may be varied as a matter of design choice, and, thus, the particular parameters of the ion implantation process should not be considered a limitation of the present invention, unless specifically set forth in the appended claims. For example, the halo implants 30A, 30B may be formed by performing an ion implantation process at a concentration ranging from approximately $1 \times 10^{12}$–$1 \times 10^{14}$ ions/cm$^2$ of the appropriate dopant atoms, e.g., boron for NMOS devices, arsenic or phosphorous for PMOS devices.

Through use of the relatively thin hard mask layer 20, devices on an integrated circuit device may be spaced more closely together, yet still allowing sufficient space in which to form the halo implants on certain devices while masking other adjacent devices. This, in turn, increases the device density on the integrated device and improves device yields. That is, by using a relatively thinner mask layer 20 instead of a relatively thicker mask layer comprised of photoresist, the shadowing by the mask layer used during the halo implantation process is reduced, thereby allowing devices to be more densely-packed.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming halo implant regions in a substrate for a transistor device comprising:

forming a gate electrode above a surface of a semiconducting substrate;

forming a hard mask layer above said gate electrode and said substrate after said gate electrode is formed;

forming a layer of photoresist above said hard mask layer;

forming an opening in said layer of photoresist;

etching said hard mask layer to define an opening therein using said layer of photoresist as a mask;

removing said layer of photoresist after etching said hard mask layer; and performing an angled implantation process through said opening in said hard mask layer after said layer of photoresist is removed to introduce dopant atoms into said substrate under at least a portion of said gate electrode to thereby form said halo implant regions, said angled implantation process being performed prior to performing an ion implant process to form source/drain regions of said device.

2. The method of claim 1, wherein forming a gate electrode above a surface of a semiconducting substrate comprises forming a gate electrode comprised of polysilicon above a surface of a semiconducting substrate.

3. The method of claim 1, wherein forming a hard mask layer above said gate electrode and said substrate comprises depositing a hard mask layer above said gate electrode and said substrate.

4. The method of claim 1, wherein forming a hard mask layer above said gate electrode and said substrate comprises forming a hard mask layer comprised of at least one of a nitride and an oxynitride above said gate electrode and said substrate.

5. The method of claim 1, wherein forming a hard mask layer above said gate electrode and said substrate comprises forming a hard mask layer comprised of silicon nitride above said gate electrode and said substrate.

6. The method of claim 1, wherein performing an angled implantation process comprises performing an angled halo implantation process using dopant atoms that are of a type that is the same as the dopant atoms used to dope said substrate.

7. The method of claim 1, wherein said substrate is doped with a p-type dopant material and said angled implantation process is performed using p-type dopant atoms.

8. The method of claim 1, wherein said substrate is doped with an n-type dopant material and said angled implantation process is performed using n-type dopant atoms.

9. The method of claim 1, wherein performing an angled implantation process through said opening in said hard mask layer to introduce dopant atoms into said substrate under at least a portion of said gate electrode comprises performing an angled implantation process at an angle of approximately 45 degrees through said opening in said hard mask layer to introduce dopant atoms into said substrate under at least a portion of said gate electrode.

10. The method of claim 1, wherein performing an angled implantation process through said opening in said hard mask layer to introduce dopant atoms into said substrate under at least a portion of said gate electrode comprises performing an angled implantation process at a dopant concentration ranging from approximately $1 \times 10^{12}$–$1 \times 10^{14}$ ions/cm$^2$ through said opening in said hard mask layer to introduce dopant atoms into said substrate under at least a portion of said gate electrode.

11. A method of forming halo implant regions in a substrate for a transistor device comprising:

forming a gate electrode comprised of polysilicon above a surface of a semiconducting substrate;

depositing a hard mask layer above said gate electrode and said substrate after said gate electrode is formed;

forming a layer of photoresist above said hard mask layer;

forming an opening in said layer of photoresist;

etching said hard mask layer to define an opening therein using said layer of photoresist as a mask;

removing said layer of photoresist after etching said hard mask layer; and performing an angled implantation process through said opening in said hard mask layer after said layer of photoresist is removed to introduce dopant atoms into said substrate under at least a portion of said gate electrode to thereby form said halo implant regions, said angled implantation process being performed prior to performing an ion implant process to form source/drain regions of said device.

12. The method of claim 11, wherein depositing a hard mask layer above said gate electrode and said substrate comprises depositing a hard mask layer comprised of at least one of a nitride and an oxynitride above said gate electrode and said substrate.

13. The method of claim 11, wherein depositing a hard mask layer above said gate electrode and said substrate comprises depositing a hard mask layer comprised of silicon nitride above said gate electrode and said substrate.

14. The method of claim 11, wherein depositing a hard mask layer above said gate electrode and said substrate comprises depositing a hard mask layer comprised of silicon nitride having a thickness ranging from approximately 1500–4000 Å above said gate electrode and said substrate.

15. The method of claim 11, wherein performing an angled implantation process through said opening in said hard mask layer to introduce dopant atoms into said substrate under at least a portion of said gate electrode comprises performing an angled implantation process at an angle of approximately 45 degrees through said opening in said hard mask layer to introduce dopant atoms into said substrate under at least a portion of said gate electrode.

16. The method of claim 11, wherein performing an angled implantation process through said opening in said hard mask layer to introduce dopant atoms into said substrate under at least a portion of said gate electrode comprises performing an angled implantation process at a dopant concentration ranging from approximately $1 \times 10^{12} - 1 \times 10^{14}$ ions/cm$^2$ through said opening in said hard mask layer to introduce dopant atoms into said substrate under at least a portion of said gate electrode.

17. The method of claim 11, wherein performing an angled implantation process comprises performing an angled halo implantation process using dopant atoms that are of a type that is the same as the dopant atoms used to dope said substrate.

18. The method of claim 11, wherein said substrate is doped with a p-type dopant material and said angled implantation process is performed using p-type dopant atoms.

19. The method of claim 11, wherein said substrate is doped with an n-type dopant material and said angled implantation process is performed using n-type dopant atoms.

20. A method of forming halo implant regions in a substrate for a transistor device comprising:
   forming a gate electrode comprised of polysilicon above a surface of a semiconducting substrate;
   depositing a hard mask layer comprised of silicon nitride having a thickness ranging from approximately 1500–4000 Å above said gate electrode and said substrate after said gate electrode is formed;
   forming a layer of photoresist above said hard mask layer;
   forming an opening in said layer of photoresist;
   etching said hard mask layer to define an opening therein using said layer of photoresist as a mask;
   removing said layer of photoresist after etching said hard mask; and
   performing an angled implantation process through said opening in said hard mask layer after removing said layer of photoresist to introduce dopant atoms into said substrate under at least a portion of said gate electrode to thereby form said halo implant regions, said angled implantation process being performed prior to performing an ion implant process to form source/drain regions of said device.

21. The method of claim 20, wherein performing an angled implantation process through said opening in said hard mask layer to introduce dopant atoms into said substrate under at least a portion of said gate electrode comprises performing an angled implantation process at an angle of approximately 45 degrees through said opening in said hard mask layer to introduce dopant atoms into said substrate under at least a portion of said gate electrode.

22. The method of claim 20, wherein performing an angled implantation process through said opening in said hard mask layer to introduce dopant atoms into said substrate under at least a portion of said gate electrode comprises performing an angled implantation process at a dopant concentration ranging from approximately $1 \times 10^{12} - 1 \times 10^{14}$ ions/cm$^2$ through said opening in said hard mask layer to introduce dopant atoms into said substrate under at least a portion of said gate electrode.

23. The method of claim 20, wherein performing an angled implantation process comprises performing an angled halo implantation process using dopant atoms that are of a type that is the same as the dopant atoms used to dope said substrate.

24. The method of claim 20, wherein said substrate is doped with a p-type dopant material and said angled implantation process is performed using p-type dopant atoms.

25. The method of claim 20, wherein said substrate is doped with an n-type dopant material and said angled implantation process is performed using n-type dopant atoms.

26. A method of forming halo implant regions in a substrate for a transistor device comprising:
   forming a gate electrode above a surface of a semiconducting substrate, said gate electrode comprised of a plurality of sidewalls;
   forming a hard-mask layer above said gate electrode and said substrate after said gate electrode is formed;
   forming a layer of photoresist above said hard mask layer;
   forming an opening in said layer of photoresist;
   etching said hard mask layer to define an opening therein using said layer of photoresist as a mask to thereby expose said gate electrode and said sidewalls of said gate electrode;
   removing said layer of photoresist after etching said hard mask layer; and
   performing an angled implantation process through said opening in said hard mask layer after said layer of photoresist is removed to introduce dopant atoms into saidsubstrate under at least a portion of said gate electrode to thereby form said halo implant regions, said angled implantation process being performed prior to performing an ion implant process to form source/drain regions of said device.

27. A method of forming halo implant regions in a semiconducting substrate for a transistor device, comprising:
   forming a gate electrode above a surface of said semiconducting substrate, said gate electrode comprised of a plurality of sidewalls, said substrate being doped with a first type of dopant material;

forming a hard mask layer above said gate electrode and on said surface of said substrate after said gate electrode is formed;

forming a layer of photoresist above said hard mask layer;

forming an opening in said layer of photoresist;

etching said hard mask layer to define an opening therein using said layer of photoresist as a mask to thereby expose said gate electrode, said sidewalls of said gate electrode, and a portion of said surface of said substrate;

removing said layer of photoresist after etching said hard mask layer; and performing an angled implantation process through said opening in said hard mask layer after said layer of photoresist is removed to introduce dopant atoms into said substrate under at least a portion of said gate electrode to thereby form said halo implant regions, said angled implantation process being performed prior to performing an ion implant process to form source/drain regions of said device, said angled implant process being performed with a dopant material that is of a type opposite said first type of dopant material.

* * * * *